US010248504B2

(12) United States Patent
Baptist et al.

(10) Patent No.: US 10,248,504 B2
(45) Date of Patent: Apr. 2, 2019

(54) LIST REQUEST PROCESSING DURING A DISPERSED STORAGE NETWORK CONFIGURATION CHANGE

(71) Applicant: International Business Machines Corporation, Armonk, NY (US)

(72) Inventors: Andrew D. Baptist, Mt. Pleasant, WI (US); Ravi V. Khadiwala, Bartlett, IL (US); Manish Motwani, Chicago, IL (US); Jason K. Resch, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 15/194,721

(22) Filed: Jun. 28, 2016

(65) Prior Publication Data

US 2017/0004156 A1 Jan. 5, 2017

Related U.S. Application Data

(60) Provisional application No. 62/186,590, filed on Jun. 30, 2015.

(51) Int. Cl.
*G06F 17/30* (2006.01)
*G06F 11/10* (2006.01)
(Continued)

(52) U.S. Cl.
CPC .......... *G06F 11/1076* (2013.01); *G06F 3/064* (2013.01); *G06F 3/065* (2013.01);
(Continued)

(58) Field of Classification Search
CPC .. G06F 11/1076; G06F 3/065; G06F 11/1662; G06F 17/3053; G06F 17/30575;
(Continued)

(56) References Cited

U.S. PATENT DOCUMENTS 4,092,732 A  5/1978 Ouchi
5,454,101 A  9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Albert M Phillips, III
(74) *Attorney, Agent, or Firm* — Garlick & Markison; Timothy W. Markison; Timothy D. Taylor

(57) ABSTRACT

A method includes identifying resources that are affiliated with a range of slice names of a listing request. The method further includes creating an ordered classification of the resources. The method further includes a resource determining whether it is in a last class of the ordered classification. When the resource is in the last class, it processes the listing request to generate a listing response and sends the listing response to another resource in a next lower class. When the resource is not in the last class, it identifies a second resource for proxying of the listing request and sends the listing request to the second resource. The method further includes receiving a cumulated listing response from the second resource. The method further includes processing the listing request to generate the listing response. The method further includes combining the listing response with the cumulated listing response.

16 Claims, 12 Drawing Sheets

(51) Int. Cl.

| | | |
|---|---|---|
| *G06F 3/06* | (2006.01) | |
| *G06F 11/16* | (2006.01) | |
| *H03M 13/33* | (2006.01) | |
| *H04L 29/08* | (2006.01) | |
| *H04L 29/06* | (2006.01) | |
| *H03M 13/37* | (2006.01) | |
| *H03M 13/15* | (2006.01) | |

(52) U.S. Cl.
CPC ............ *G06F 3/067* (2013.01); *G06F 3/0619* (2013.01); *G06F 11/1662* (2013.01); *G06F 17/3053* (2013.01); *G06F 17/30312* (2013.01); *G06F 17/30545* (2013.01); *G06F 17/30575* (2013.01); *G06F 17/30578* (2013.01); *H03M 13/33* (2013.01); *H03M 13/3761* (2013.01); *H04L 65/4076* (2013.01); *H04L 67/06* (2013.01); *H04L 67/1095* (2013.01); *H04L 67/1097* (2013.01); *H04L 67/16* (2013.01); *G06F 2201/805* (2013.01); *H03M 13/1515* (2013.01)

(58) Field of Classification Search
CPC ......... G06F 17/30578; G06F 17/30545; G06F 17/30312; G06F 3/0619; G06F 3/064; G06F 3/067; G06F 2201/805; H03M 13/3761; H03M 13/33; H03M 13/1515; H04L 65/4076; H04L 67/06; H04L 67/16; H04L 67/1095; H04L 67/1097
See application file for complete search history.

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0078959 A1* | 4/2007 | Ye .......................... H04L 67/16 709/223 |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2014/0123316 A1* | 5/2014 | Leggette ............ H04L 67/1097 726/28 |
| 2015/0381730 A1* | 12/2015 | Resch .................. G06F 3/0616 709/225 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

(56) References Cited

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

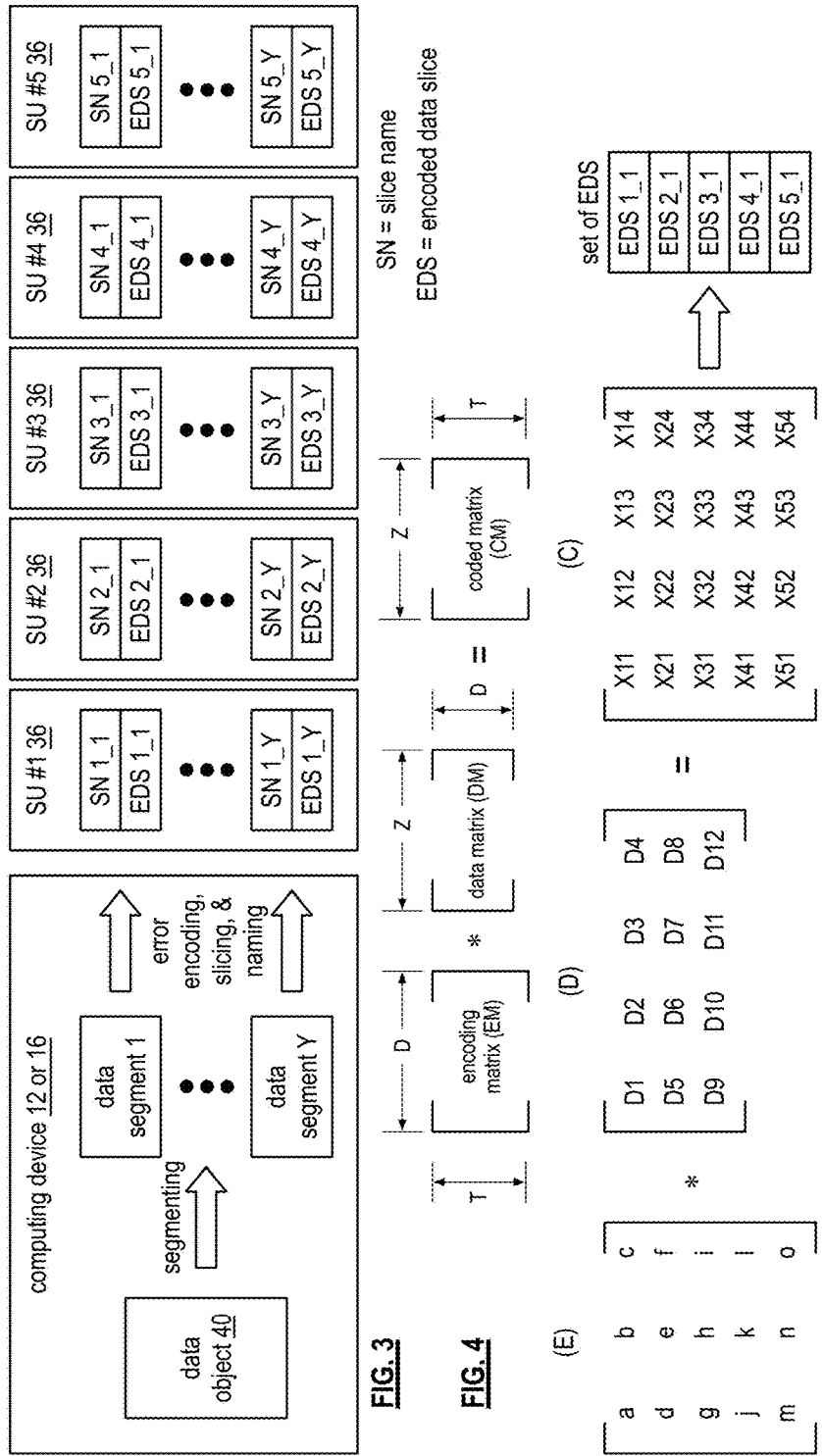

LIST REQUEST PROCESSING DURING A DISPERSED STORAGE NETWORK CONFIGURATION CHANGE

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

In a dispersed storage system, from time to time, data is transferred from one storage unit to another. When there is a significant amount of data to be transferred, it takes time to accomplish the data transfer. During such data transfers, data access requests for the data being transferred are likely to be received.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
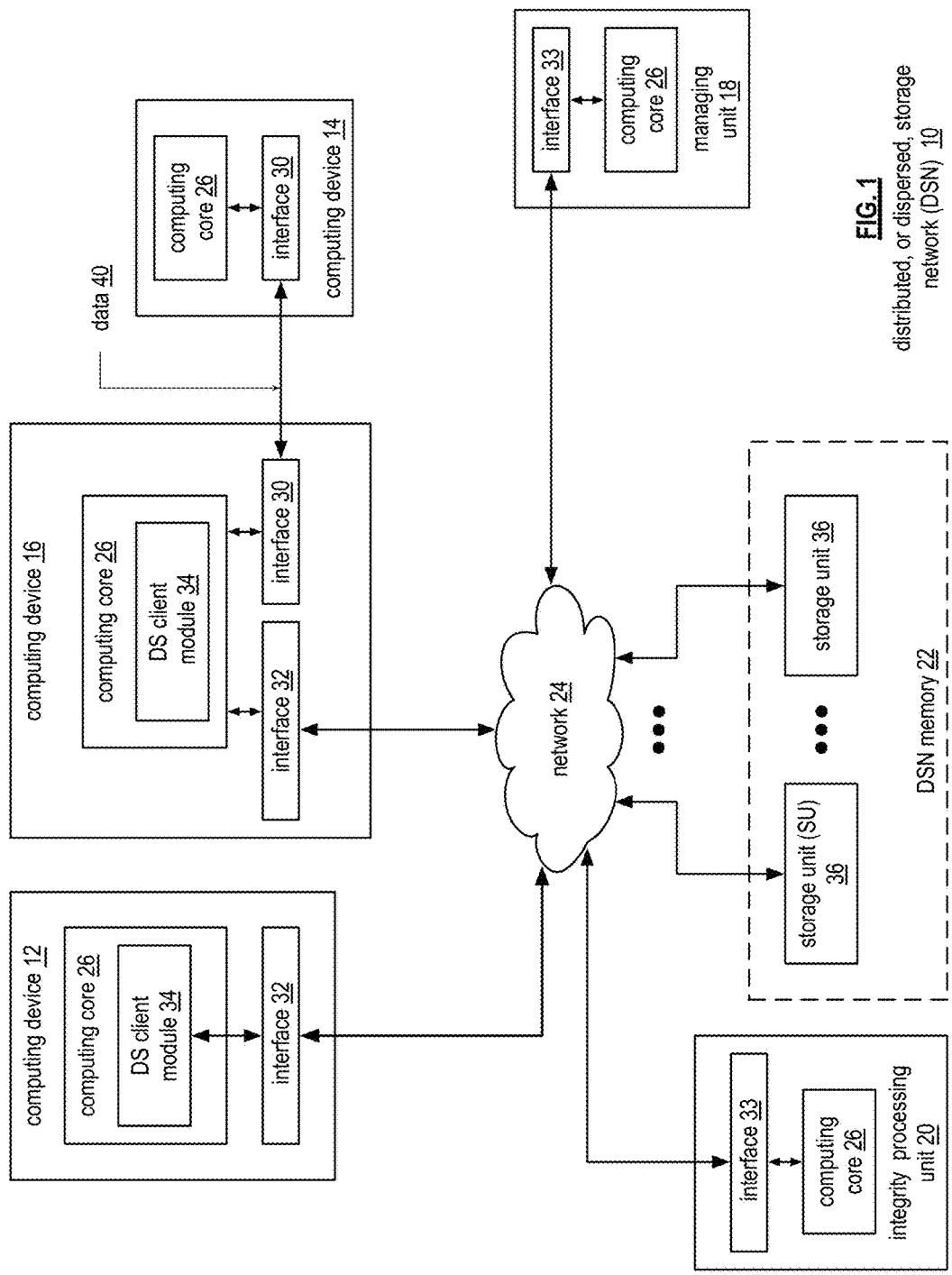
FIG. 1 is a schematic block diagram of an embodiment of a dispersed or distributed storage network (DSN) in accordance with the present invention.

FIG. 1 is FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
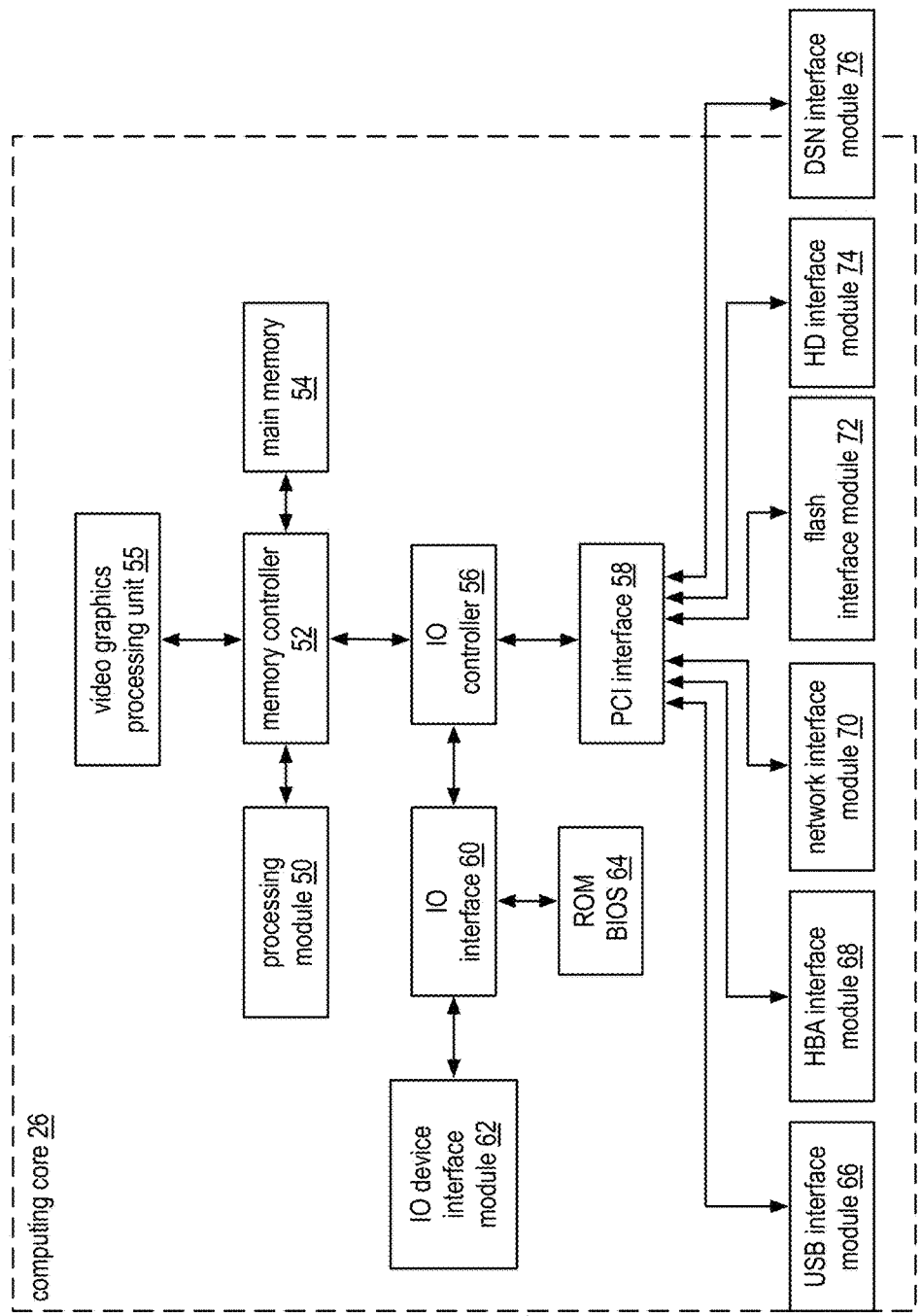
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
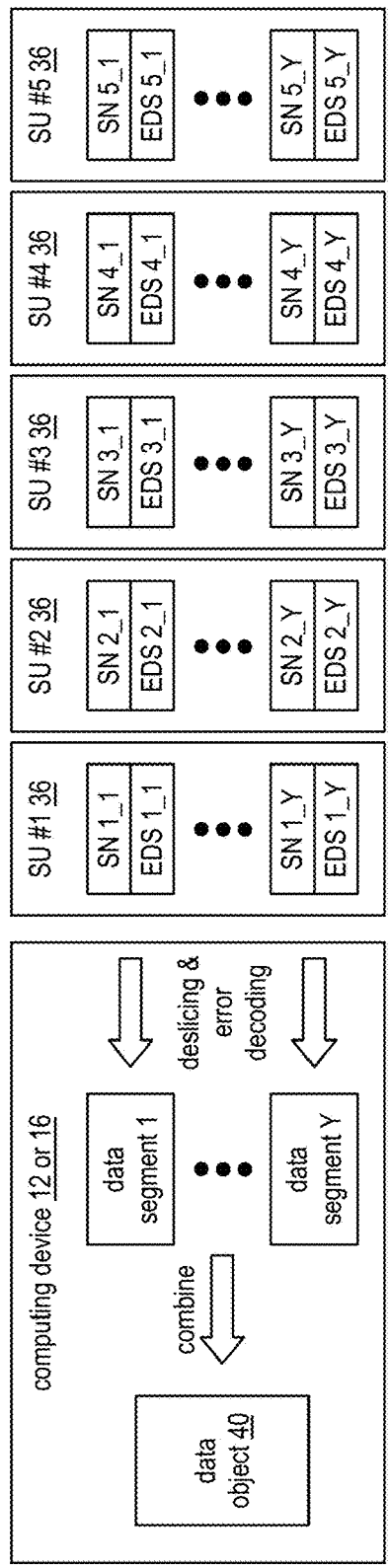
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
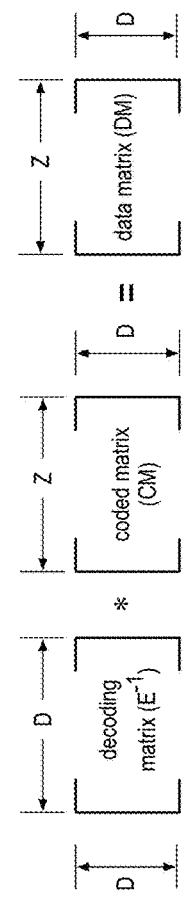
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
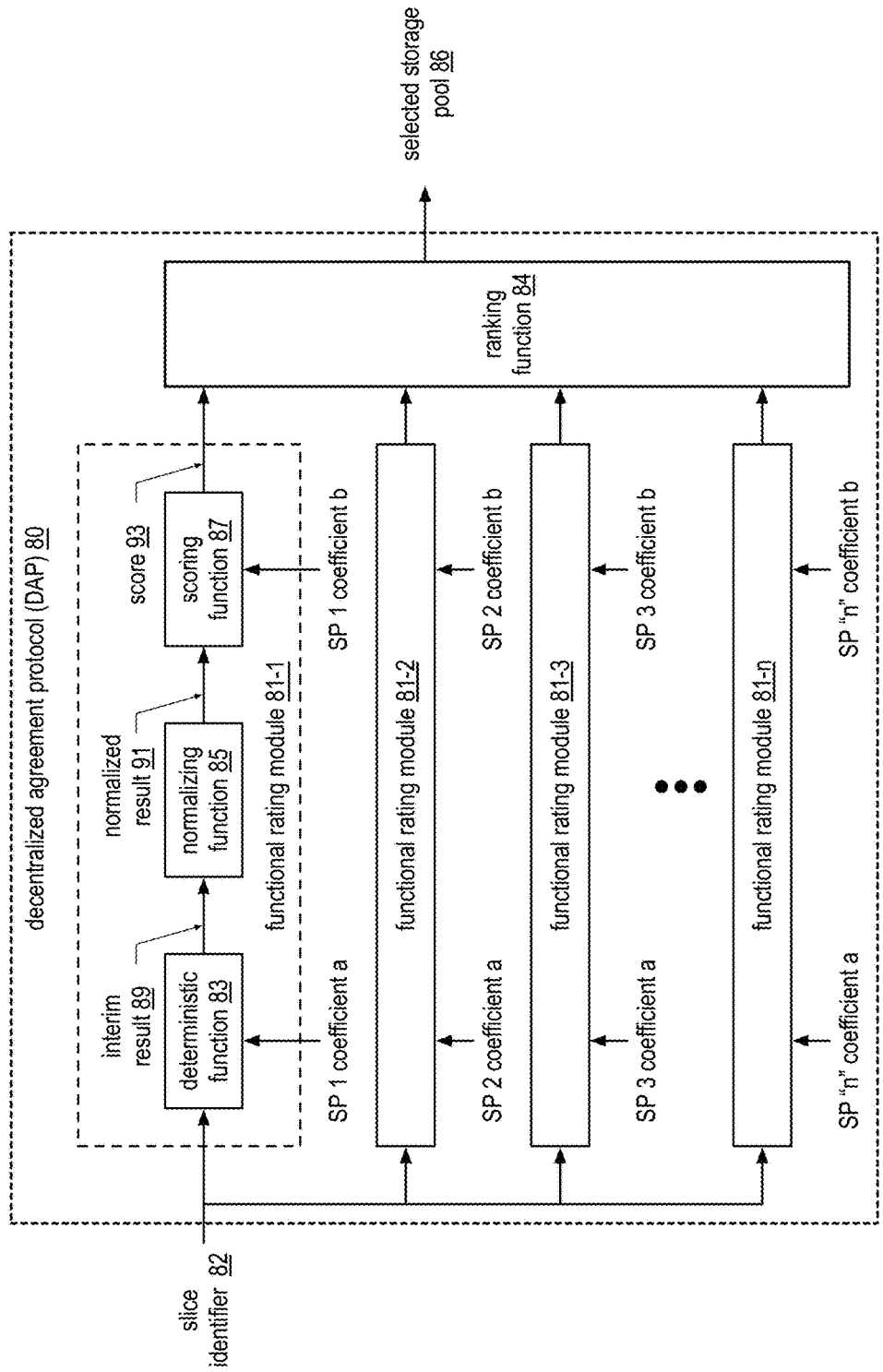
FIG. 9 is a schematic block diagram of an embodiment of decentralized, or distributed, agreement protocol in accordance with the present invention.

FIG. 9 is a schematic block diagram of an embodiment of a decentralized, or distributed, agreement protocol (DAP) 80 that may be implemented by a computing device, a storage unit, and/or any other device or unit of the DSN to determine where to store encoded data slices or where to find stored encoded data slices. The DAP 80 includes a plurality of functional rating modules 81. Each of the functional rating modules 81 includes a deterministic function 83, a normalizing function 85, and a scoring function 87.

Each functional rating module 81 receives, as inputs, a slice identifier 82 and storage pool (SP) coefficients (e.g., a first functional rating module 81-1 receives SP 1 coefficients "a" and b). Based on the inputs, where the SP coefficients are different for each functional rating module 81, each functional rating module 81 generates a unique score 93 (e.g., an alpha-numerical value, a numerical value, etc.). The ranking function 84 receives the unique scores 93 and orders them based on an ordering function (e.g., highest to lowest, lowest to highest, alphabetical, etc.) and then selects one as a selected storage pool 86. Note that a storage pool includes one or more sets of storage units 86. Further note that the slice identifier 82 corresponds to a slice name or common attributes of set of slices names. For example, for a set of encoded data slices, the slice identifier 120 specifies a data segment number, a vault ID, and a data object ID, but leaves open ended, the pillar number. As another example, the slice identifier 82 specifies a range of slice names (e.g., 0000 0000 to FFFF FFFF).

As a specific example, the first functional module 81-1 receives the slice identifier 82 and SP coefficients for storage pool 1 of the DSN. The SP coefficients includes a first coefficient (e.g., "a") and a second coefficient (e.g., "b"). For example, the first coefficient is a unique identifier for the corresponding storage pool (e.g., SP #1's ID for SP 1 coefficient "a") and the second coefficient is a weighting factor for the storage pool. The weighting factors are derived to ensure, over time, data is stored in the storage pools in a fair and distributed manner based on the capabilities of the storage units within the storage pools.

For example, the weighting factor includes an arbitrary bias which adjusts a proportion of selections to an associated location such that a probability that a source name will be mapped to that location is equal to the location weight divided by a sum of all location weights for all locations of comparison (e.g., locations correspond to storage units). As a specific example, each storage pool is associated with a location weight factor based on storage capacity such that, storage pools with more storage capacity have a higher location weighting factor than storage pools with less storage capacity.

The deterministic function 83, which may be a hashing function, a hash-based message authentication code function, a mask generating function, a cyclic redundancy code function, hashing module of a number of locations, consistent hashing, rendezvous hashing, and/or a sponge function, performs a deterministic function on a combination and/or concatenation (e.g., add, append, interleave) of the slice identifier 82 and the first SP coefficient (e.g., SU 1 coefficient "a") to produce an interim result 89.

The normalizing function 85 normalizes the interim result 89 to produce a normalized interim result 91. For instance, the normalizing function 85 divides the interim result 89 by a number of possible output permutations of the deterministic function 83 to produce the normalized interim result. For example, if the interim result is 4,325 (decimal) and the number of possible output permutations is 10,000, then the normalized result is 0.4325.

The scoring function 87 performs a mathematical function on the normalized result 91 to produce the score 93. The mathematical function may be division, multiplication, addition, subtraction, a combination thereof, and/or any mathematical operation. For example, the scoring function divides the second SP coefficient (e.g., SP 1 coefficient "b") by the negative log of the normalized result (e.g., $e^y=x$ and/or $\ln(x)=y$). For example, if the second SP coefficient is 17.5 and the negative log of the normalized result is 1.5411 (e.g. $e^{(0.4235)}$) the score is 11.3555.

The ranking function 84 receives the scores 93 from each of the function rating modules 81 and orders them to produce a ranking of the storage pools. For example, if the ordering is highest to lowest and there are five storage units in the DSN, the ranking function evaluates the scores for five storage units to place them in a ranked order. From the ranking, the ranking module 84 selects one the storage pools 86, which is the target for a set of encoded data slices.

The DAP 80 may further be used to identify a set of storage units, an individual storage unit, and/or a memory device within the storage unit. To achieve different output results, the coefficients are changed according to the desired location information. The DAP 80 may also output the ranked ordering of the scores.

Figure 10:
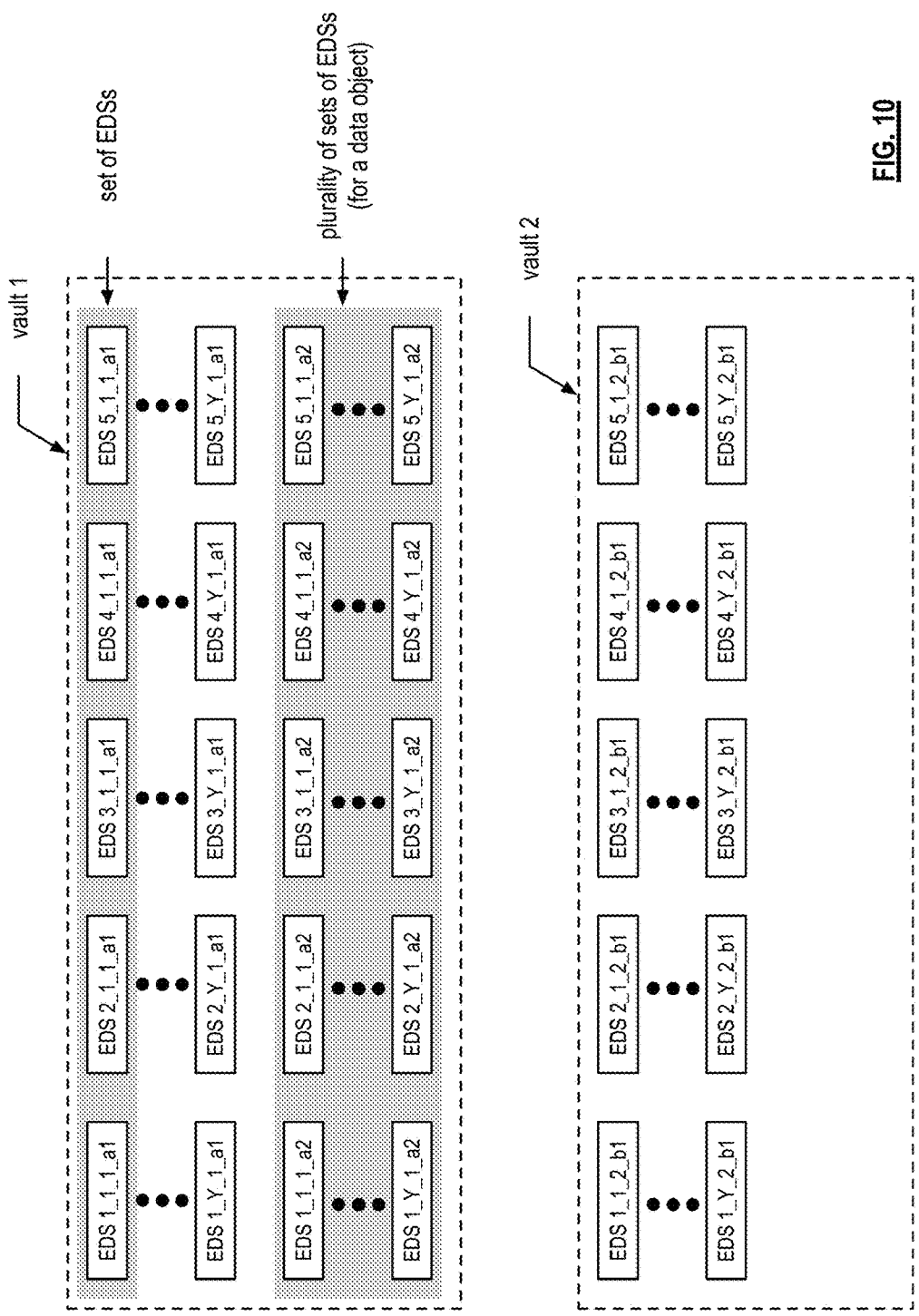
FIG. 10 is a schematic block diagram of an example of creating pluralities of sets of slices in accordance with the present invention.

FIG. 10 is a schematic block diagram of an example of creating pluralities of sets of slices. Each plurality of sets of encoded data slices (EDSs) corresponds to the encoding of a data object, a portion of a data object, or multiple data object, where a data object is one or more of a file, text, data, digital information, etc. For example, the highlighted plurality of encoded data slices corresponds to a data object having a data identifier of "a2".

Each encoded data slices of each set of encoded data slices is uniquely identified by its slice name, which is also used as at least part of the DSN address for storing the encoded data slice. As shown, a set of EDSs includes EDS 1_1_1_a1 through EDS 5_1_1_a1. The EDS number includes pillar number, data segment number, vault ID, and data object ID. Thus, for EDS 1_1_1_a1, it is the first EDS of a first data segment of data object "a1" and is to be stored, or is stored, in vault 1. Note that vaults are a logical memory container supported by the storage units of the DSN. A vault may be allocated to one or more user computing devices.

As is further shown, another plurality of sets of encoded data slices are stored in vault 2 for data object "b1". There are Y sets of EDSs, where Y corresponds to the number of data segments created by segmenting the data object. The last set of EDSs of data object "b1" includes EDS 1_Y_2_b1 through EDS 5_Y_2_b1. Thus, for EDS 1_Y_2_b1, it is the first EDS of the last data segment "Y" of data object "b1" and is to be stored, or is stored, in vault 2.

Figure 11:
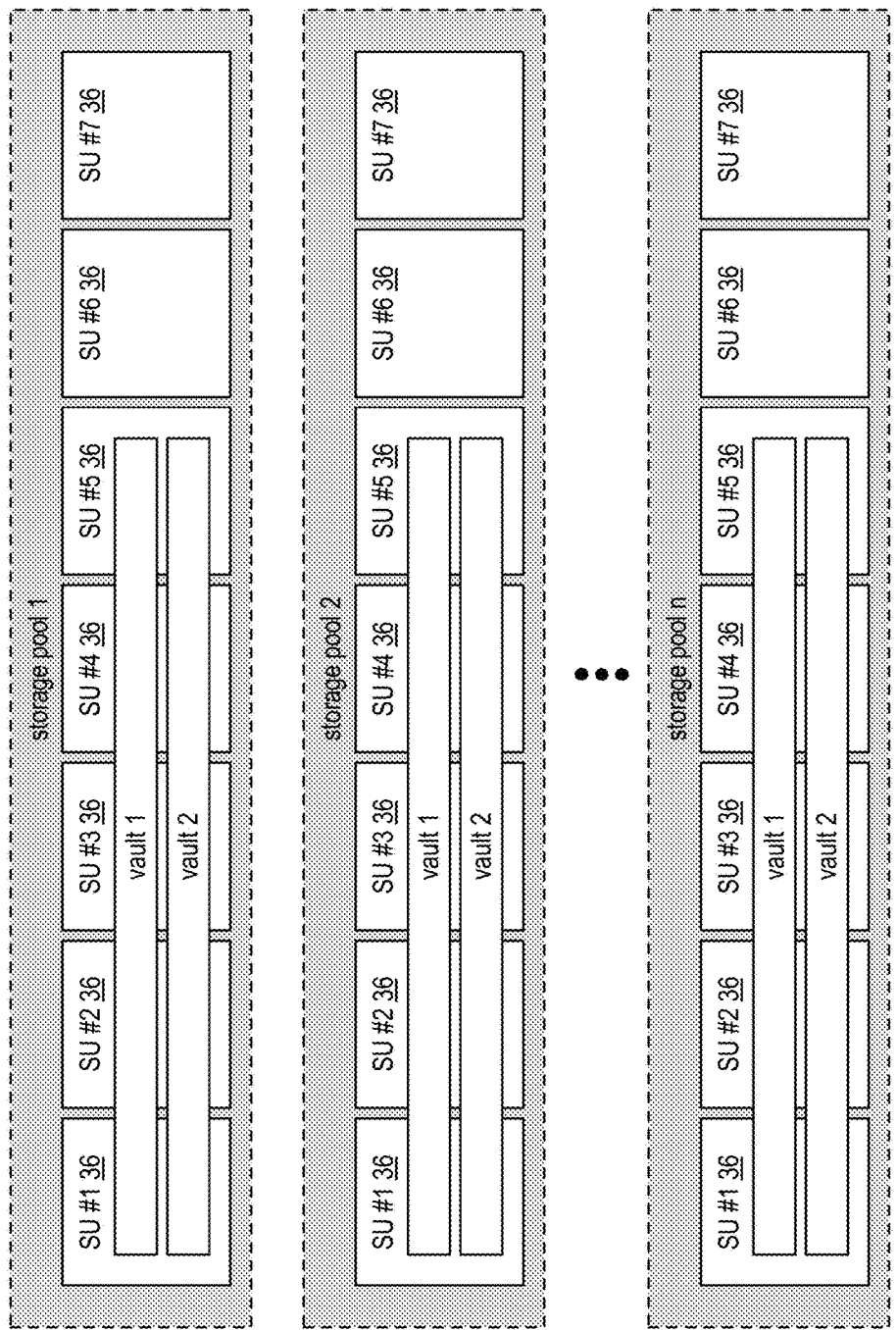
FIG. 11 is a schematic block diagram of an example of storage vaults in accordance with the present invention.

FIG. 11 is a schematic block diagram of an example of storage vaults spanning multiple storage pools. In this example, the DSN memory 22 includes a plurality of storage units 36 arranged into a plurality of storage pools (e.g., 1-n). In this example, each storage pool includes seven storage units for ease of illustration. A storage pool, however, can have many more storage units than seven and, from storage pool to storage pool, may have different numbers of storage units.

The storage pools 1-n support two vaults (vault 1 and vault 2) using only five of seven of the storage units. The number of storage units within a vault correspond to the pillar width number, which is five in this example. Note that a storage pool may have rows of storage units, where SU #1 represents a plurality of storage units, each corresponding to a first pillar number; SU #2 represents a second plurality of storage units, each corresponding to a second pillar number; and so on. Note that other vaults may use more or less than a width of five storage units.

Figure 12:
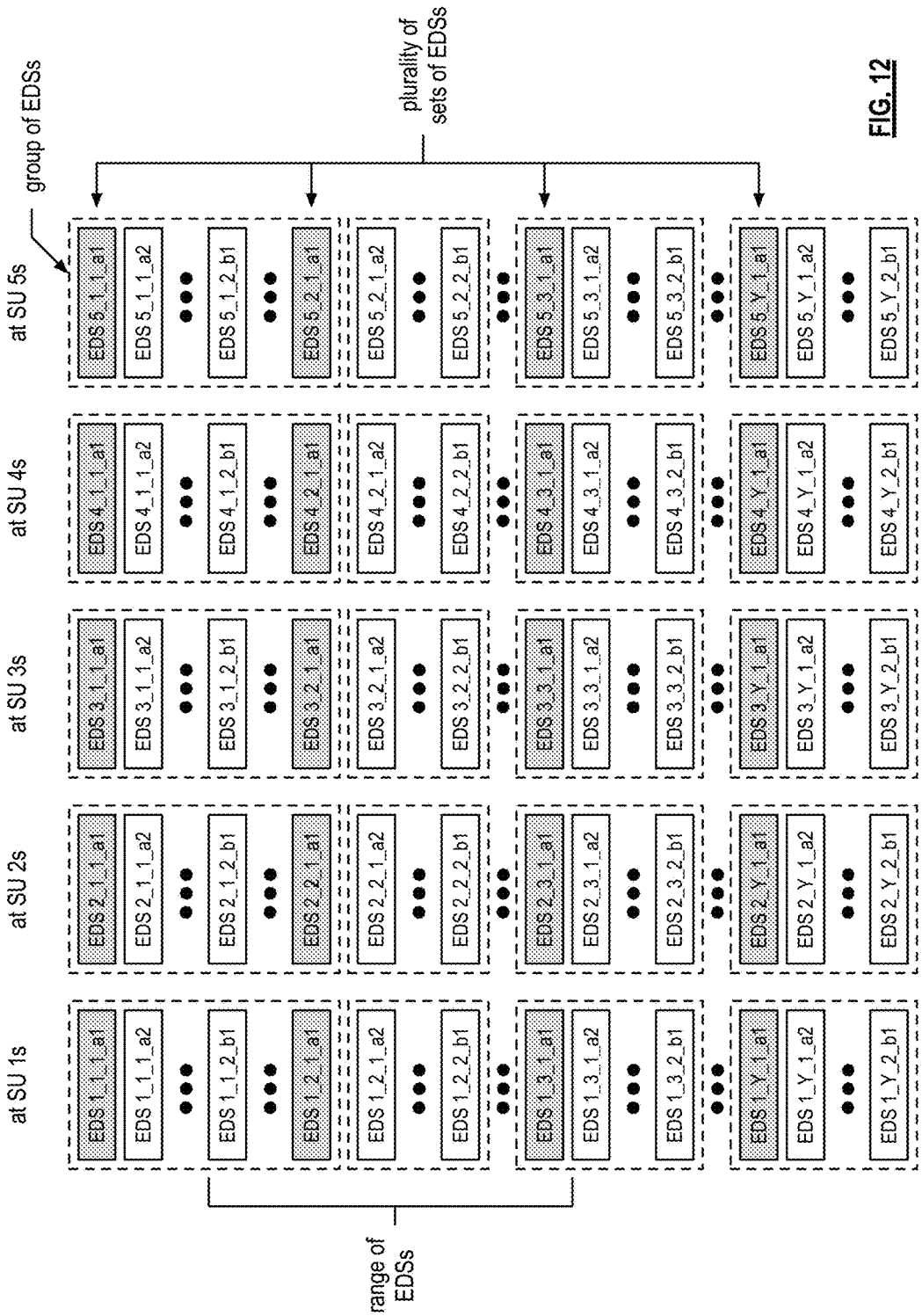
FIG. 12 is a schematic block diagram of an example of storing pluralities of sets of slices in accordance with the present invention.

FIG. 12 is a schematic block diagram of an example of storing pluralities of sets of slices in accordance with the distributed agreement protocol (DAP) 80 of FIG. 9. The DAP 80 uses slice identifiers (e.g., the slice name or common elements thereof (e.g., the pillar number, the data segment number, the vault ID, and/or the data object ID)) to identify, for one or more sets of encoded data slices, a set, or pool, of storage units. With respect to the three pluralities of sets of encoded data slices (EDSs) of FIG. 11, the DAP 80 approximately equally distributes the sets of encoded data slices throughout the DSN memory (e.g., among the various storage units).

The first column corresponds to storage units having a designation of SU #1 in their respective storage pool or set of storage units and stores encoded data slices having a pillar number of 1. The second column corresponds to storage units having a designation of SU #2 in their respective storage pool or set of storage units and stores encoded data slices having a pillar number of 2, and so on. Each column of EDSs is divided into one or more groups of EDSs. The delineation of a group of EDSs may correspond to a storage unit, to one or more memory devices within a storage unit, or multiple storage units. Note that the grouping of EDSs allows for bulk addressing, which reduces network traffic.

A range of encoded data slices (EDSs) spans a portion of a group, spans a group, or spans multiple groups. The range may be numerical range of slice names regarding the EDSs, one or more source names (e.g., common aspect shared by multiple slice names), a sequence of slice names, or other slice selection criteria.

Figure 13:
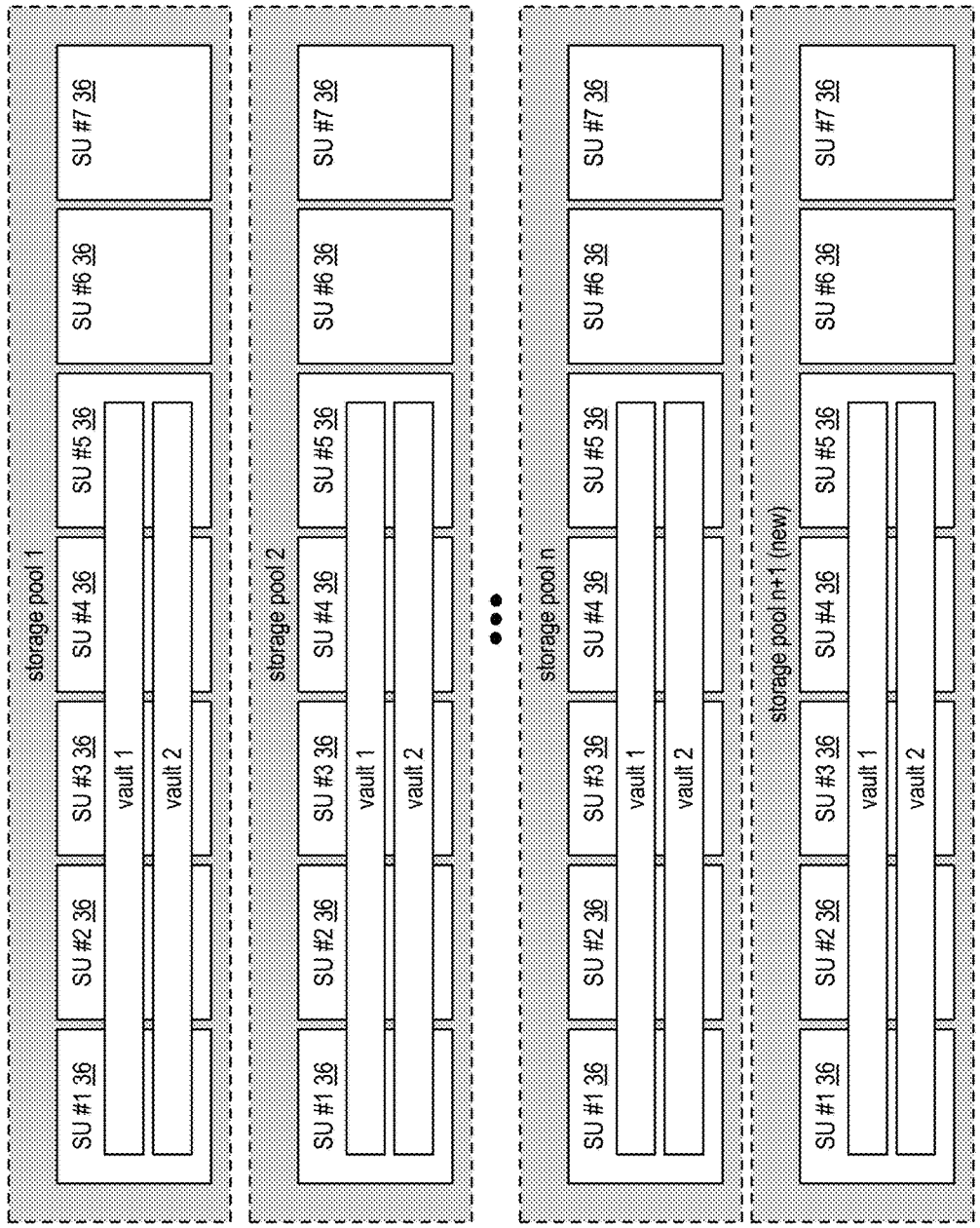
FIG. 13 is a schematic block diagram of an example of adding a storage pool to the DSN in accordance with the present invention.

FIG. 13 is a schematic block diagram of an example of adding a storage pool to the DSN. In this example storage pool n+1 is added and is supporting vaults 1 and 2. As result, the distributed agreement protocol (DAP) 80 of FIG. 9 is changed to include another functional rating module 81 for the new storage pool and the second coefficients (e.g., "b", which correspond to the weight factor) are adjusted for some, if not all, of the other functional rating modules 81. As a result of changing the DAP 80, storage responsibility for encoded data slices is going to change, causing them to be transferred between the storage units. When there are significant numbers of encoded data slices to be transferred and there are hundreds to tens of thousands of resources in the DSN (e.g., computing devices, storage units, managing units, integrity units performing rebuilding, etc.), the updating of the DSN is complex and time consuming.

While the DSN is being updated based on the new DAP, data access requests, listing requests, and other types of requests regarding the encoded data slices are still going to be received and need to be processed in a timely manner. Such requests will be based on the old DAP. As such, a request for an encoded data slice (EDS), or information about the EDS, will go to the storage unit identified using the DAP 80 prior to updating it. If the storage unit has already transferred the EDS to the storage unit identified using the new DAP 80, then the storage unit functions as proxy for the new storage unit and the requesting device.

Figure 14:
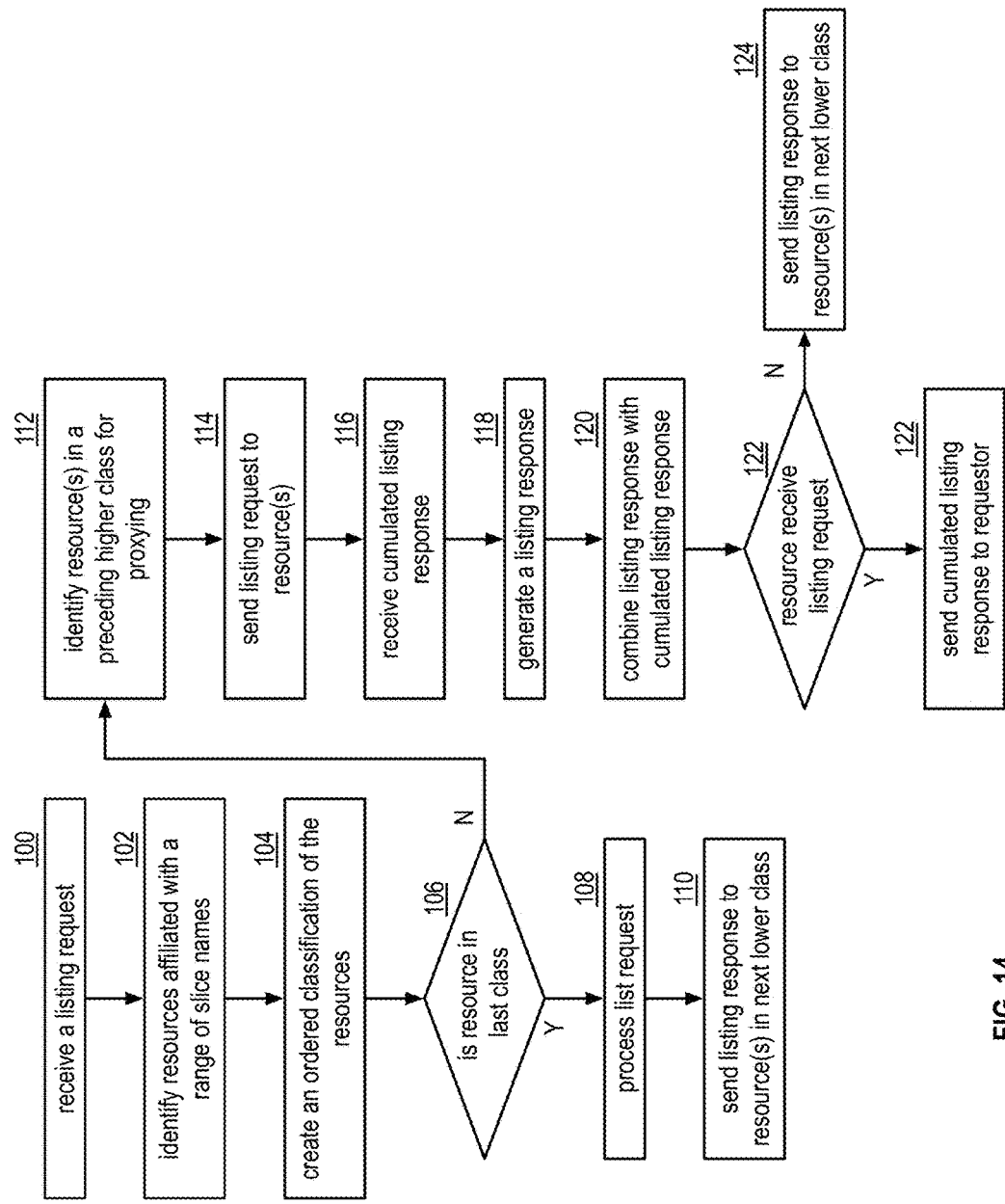
FIG. 14 is a logic diagram of an example of a method of responding to a listing request during a system configuration change in accordance with the present invention.
Figures 15, 16:
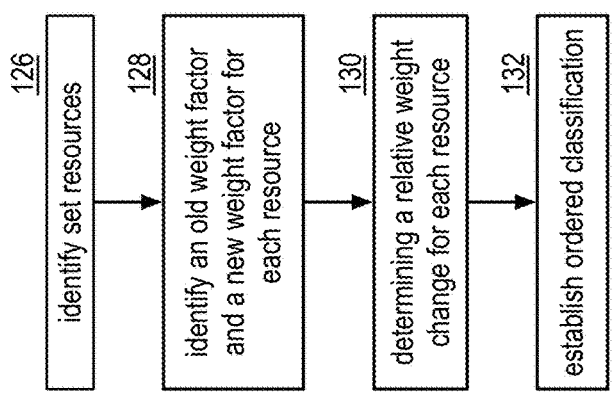
FIG. 15 is a logic diagram of an example of a method of ranking resources in accordance with the present invention.
FIG. 16 is a schematic block diagram of an example of an ordered classification of resources in accordance with the present invention.

When a listing request is received, a resources processes it in accordance with the method of FIGS. 14 and 15. Note that a listing request is one that is requesting information about a range of slice names. In particular, within the range of slice names, how many of the slice names are associated with a valid encoded data slice (e.g., one that is stored in a storage unit, one that is being created or modified by a computing device, and/or one that is being rebuilt by a rebuilding agent of the integrity unit).

FIG. 14 is a logic diagram of an example of a method of responding to a listing request during a system configuration change. The system configuration change of the DSN includes adding a resource to the DSN, deleting a resource from the DSN, and/or changing one or more weight factors of the DAP 80. Note that a resource includes a storage location within a storage unit, a storage unit, a storage pool, a computing device, a managing unit, and/or a rebuilder of the integrity unit or within a storage unit.

The method begins at step 100 where one of the resources of the DSN receives a listing request. The method continues at step 102 where the resource identifies a set of the resources that are affiliated with a range of slice names identified by the listing request. The method continues at step 104 where the resource, and other resources in the set of resources, create an ordered classification of the set of resources based on the system configuration change. An example of creating an ordered classification will be discussed in greater detail with reference to one or more of FIGS. 15-17.

The method continues at step 106 where the resource determines whether it is in a last class of the ordered classification. When the resource is in the last class, the method continues at step 108 where the resource processes the listing request to generate a listing response regarding encoded data slices associated with slice names within a sub-range of slice names. For example, if the resource is a storage unit, it scans it memory for slice names in the range of slice names, which corresponds to the sub-range of slices names. For each slice name that has a valid encoded data slice stored for it, the slice name is added to the listing response. The method continues at step 110 where the resource sends the listing response to another resource in a lower higher class of the ordered classification. An example of this will be discussed in greater detail with reference to one or more of FIGS. 16 and 17.

When the resource is not in the last class, the method continues at step 112, where the resources identifies one or more others resource of the set of resources for proxying of the listing request. In particular, for each resource in the next higher class of the ordered classification, the resource will proxy the listing request. The method continues with the resource sending the listing request to the other resource(s) in the next higher class.

The method continues at step 116 where the resource receives, in response to the sending, a cumulated listing response from each of the other resource(s) in the next higher class. The method continues at step 118 where the resource processes the listing request to generate the listing response regarding encoded data slices associated with slice names within the sub-range of slice names. The method continues at step 120 where the resource combines the listing response with the cumulated listing response to produce an updated cumulated listing response.

The method continues at step 122 where the resource determines whether it is the resource that received the listing request. When the resource received the listing request, the method continues at step 122 where the resource send the updated cumulated listing response to a request computing device that issued the listing request. When the resource did not receive the listing request, the method continues at step 124 where the resource sends the updated cumulated listing response to yet another resource in another next lower class of the ordered classification.

FIG. 15 is a logic diagram of an example of a method of ranking resources. The method begins at step 126 where the resource identifies the set resources for the range of slice names in accordance with a distributed agreement protocol based an old system configuration of the DSN and a new system configuration of the DSN. The method continues at step 128, where the resource identifies an old weight factor and a new weight factor for each resource in the set of resources. The old weight factor corresponds to the old system configuration of the DAP 80 and the new weight factor corresponds to new system configuration of the DAP 80. The method continues at step 130 where the resource determines a relative weight change for each resource in the set of resources based on the old weight factor and the new weight factor. The method continues at step 132 where the resource establishes the ordered classification based on the relative weight changes of the set of resources.

FIG. 16 is a schematic block diagram of an example of an ordered classification of resources A-L. Each resource has an old weight factor and a new weight factor. For example, resource C has an old weight factor of 3 and a new weight factor of 9. From the old and new weight factors, a relative weight change is determined by dividing the new weight factor by the old for each resource. As an example, resource C has a relative weight change of 3.00. Note that resources A and B have an infinity relative weight change since their old weight factor is zero (i.e., resources A and B are being added to the DSN). Further note that resources K and L have a zero relative weight change since their new weight factor is zero (i.e., resources K and L are being removed from the DSN).

From the relative weight changes, the resources are placed into classes. The resources with the highest relative weight change are in the highest class (e.g., last class) and resources with the lowest relative weight change are in the lowest class. In this example, there are eight class.

Figure 17:
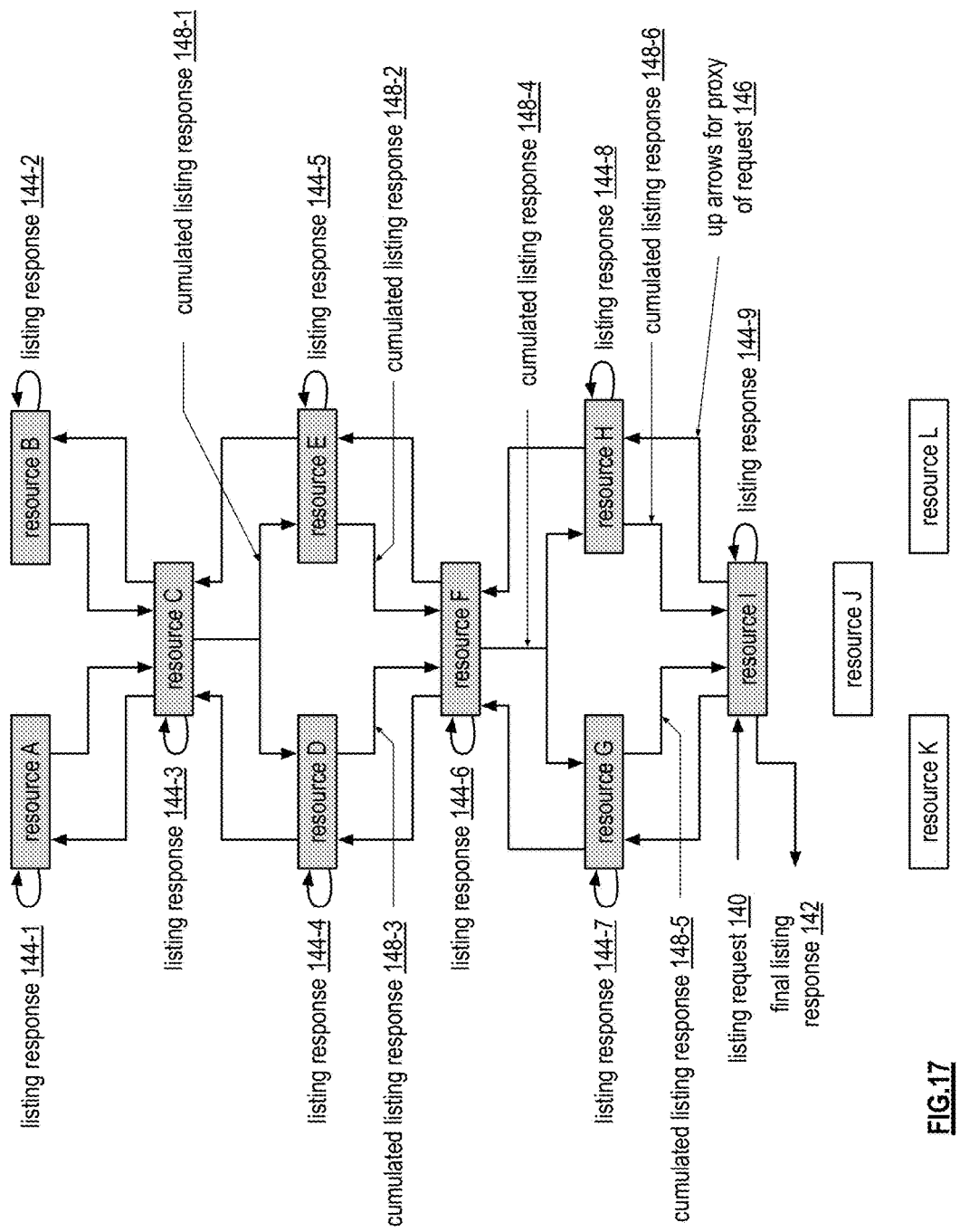
FIG. 17 is a schematic block diagram of example of responding to a listing request during a system configuration change in accordance with the present invention.

FIG. 17 is a schematic block diagram of example of responding to a listing request during a system configuration change and is based on the example of FIG. 16. The processing of the listing request begins when resource I receives the listing request 140. Resource I generates the ordered classification as shown with the highest class at the top of the figure and the lowest class at the bottom of the figure. In particular, resources A and B are in the highest class and resources K and L are in the lowest class. The other resources receive the ordered classification or generate the ordered classification.

From the ordered classification, resource I determines that it is a proxy for resources G and H. Accordingly, resource I sends the listing request 140 to both resources G and H. When resources G and H receive the listing request 140 they each determine that they are a proxy for resource F. Resource F determines that it is a proxy for resources D and E and sends both resources the listing request. Each of resources D and E determine that they are a proxy for resource C and sends the listing request to resource C. Resource C determines that it is a proxy for both resources A and B and sends them the listing request.

Resources A and B are proxies to no other resources, as such, they each generate a listing response. In particular, resource A generates a listing response 144-1 that identifies encoded data slices that it is responsible for (e.g., a list of slice names) and resource B generates its listing response 144-2. Each of resources A and B send its listing response to resource C. Resource C generates its listing response 144-3 and combines it with the listing responses of resources A and B to produce a cumulated listing response 148-1.

Resource C sends the cumulated listing response 148-1 to resources D and E. Each of resources D and E generates its listing response 144-4 and 144-5 and combines it with the cumulated listing response 148-1 from resource C. Each of resources D and E send its cumulated listing response 148-2 and 148-3 to resource F. Resource F generates its listing response 144-6 and combines it with the listing responses of resources D and E to produce a cumulated listing response 148-4.

Resource F sends the cumulated listing response 148-4 to resources G and H. Each of resources G and H generates its listing response 144-7 and 144-8 and combines it with the cumulated listing response 148-4 from resource F. Each of resources G and H send its cumulated listing response 148-5 and 148-6 to resource I. Resource I generates its listing response 144-9 and combines it with the listing responses of resources G and H to produce a final listing response 142, which it sends to the requesting computing device.

In this way, complete and accurate listing results are maintained despite an ongoing relocation in the midst of a system configuration transition from an old to a new one. Once system reconfiguration is complete, the resources no longer need to proxy listing requests using this approach. In this approach, slice names are relocated to resources in a higher class, which forms a directed acyclic graph (DAG) and prevents infinite loops as a result of proxying.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for processing and proxying a listing request by resources of a dispersed storage network (DSN) during a system configuration change, the method comprises:
identifying a set of resources that are affiliated with a range of slice names identified by the listing request;
creating an ordered classification of the set of resources based on the system configuration change;
determining, by a resource of the set of resources, whether the resource is in a last class of the ordered classification;
when the resource is in the last class:
processing the listing request to generate a listing response regarding encoded data slices associated with slice names within a sub-range of slice names of the range of slice names, wherein the sub-range of slices names is affiliated with the resource; and
sending the listing response to another resource in a lower higher class of the ordered classification;
when the resource is not in the last class:
identifying a second resource of the set of resource for proxying of the listing request, wherein the second resource is in a next higher class of the ordered classification;
sending the listing request to the second resource;
receiving, in response to the sending, a cumulated listing response from the second resource; and
processing the listing request to generate the listing response regarding encoded data slices associated with slice names within the sub-range of slice names;
combining the listing response with the cumulated listing response to produce an updated cumulated listing response.

2. The method of claim 1 further comprises:
when the resource received the listing request, sending the updated cumulated listing response to a request computing device that issued the listing request.

3. The method of claim 1 further comprises:
when the resource did not receive the listing request, sending the updated cumulated listing response to yet another resource in another next lower class of the ordered classification.

4. The method of claim 1, wherein the creating the ordered classification comprises:
identifying the set resources for the range of slice names in accordance with a distributed agreement protocol based an old system configuration of the DSN and a new system configuration of the DSN;
identifying an old weight factor and a new weight factor for each resource in the set of resources, wherein the old weight factor corresponds to the old system configuration and the new weight factor corresponds to new system configuration;
determining a relative weight change for each resource in the set of resources based on the old weight factor and the new weight factor; and
establishing the ordered classification based on the relative weight changes of the set of resources.

5. The method of claim 1, wherein the listing request comprises:
a request to at least one of: identify valid encoded data slices having slice names within the range of slice names and to determine location of the valid encoded data slices.

6. The method of claim 5, wherein the valid encoded data slices comprise:
encoded data slices that are stored in one or more storage units;
encoded data slices that are being created or modified by a computing device; and
encoded data slices that being rebuild by a rebuilding agent.

7. The method of claim 1, wherein the system configuration change comprises one or more of:
an addition of a resource;
a deletion of a resource; and
a change in weighting factors of a DAP.

8. The method of claim 1, wherein the resource comprises one of:
a storage location within a storage unit;
a storage unit;
a storage pool;
a computing device; and
a rebuilder.

9. A resource of a dispersed storage network (DSN), the resource comprises:
an interface;
a memory; and
a processing module operably coupled to the memory and the interface, wherein the processing module is operable to:
identify a set of the resources that are affiliated with a range of slice names identified by a listing request;
create an ordered classification of the set of resources based on a system configuration change;
determine whether the resource is in a last class of the ordered classification;
when the resource is in the last class:
process the listing request to generate a listing response regarding encoded data slices associated with slice names within a sub-range of slice names of the range of slice names, wherein the sub-range of slices names is affiliated with the resource; and
send, via the interface, the listing response to another resource in a next lower class of the ordered classification;
when the resource is not in the last class:
identify a second resource of the set of resource for proxying of the listing request, wherein the second resource is in a next higher class of the ordered classification;
send, via the interface, the listing request to the second resource;
receive, via the interface in response to the sending, a cumulated listing response from the second resource; and
process the listing request to generate the listing response regarding encoded data slices associated with slice names within the sub-range of slice names;
combine the listing response with the cumulated listing response to produce an updated cumulated listing response.

10. The resource of claim 9, wherein the processing module is further operable to:
when the resource received the listing request, send, via the interface, the updated cumulated listing response to a request computing device that issued the listing request.

11. The resource of claim 9, wherein the processing module is further operable to:

when the resource did not receive the listing request, send, via the interface, the updated cumulated listing response to yet another resource in another next lower class of the ordered classification.

12. The resource of claim 9, wherein the processing module is further operable to create the ordered classification by:
- identifying the set resources for the range of slice names in accordance with a distributed agreement protocol based an old system configuration of the DSN and a new system configuration of the DSN;
- identifying an old weight factor and a new weight factor for each resource in the set of resources, wherein the old weight factor corresponds to the old system configuration and the new weight factor corresponds to new system configuration;
- determining a relative weight change for each resource in the set of resources based on the old weight factor and the new weight factor; and
- establishing the ordered classification based on the relative weight changes of the set of resources.

13. The resource of claim 9, wherein the listing request comprises:
a request to at least one of: identify valid encoded data slices having slice names within the range of slice names and to determine location of the valid encoded data slices.

14. The resource of claim 13, wherein the valid encoded data slices comprise:
- encoded data slices that are stored in one or more storage units;
- encoded data slices that are being created or modified by a computing device; and
- encoded data slices that being rebuild by a rebuilding agent.

15. The resource of claim 9, wherein the system configuration change comprises one or more of:
- an addition of a resource;
- a deletion of a resource; and
- a change in weighting factors of a DAP.

16. The resource of claim 9 comprises one of:
- a storage location within a storage unit;
- a storage unit;
- a storage pool;
- a computing device; and
- a rebuilder.

* * * * *